United States Patent
Cao et al.

(10) Patent No.: US 10,615,224 B2
(45) Date of Patent: Apr. 7, 2020

(54) MEMORY CELL, MEMORY CELL ARRAY AND OPERATING METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Heng Cao, Shanghai (CN); Sheng Fen Chiu, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 0 days.

(21) Appl. No.: 16/248,744

(22) Filed: Jan. 15, 2019

(65) Prior Publication Data
US 2019/0221611 A1    Jul. 18, 2019

(30) Foreign Application Priority Data
Jan. 17, 2018 (CN) .......................... 2018 1 0043063

(51) Int. Cl.
*H01L 27/24* (2006.01)
*H01L 45/00* (2006.01)
*G11C 13/00* (2006.01)

(52) U.S. Cl.
CPC ........ *H01L 27/2409* (2013.01); *G11C 13/004* (2013.01); *G11C 13/0004* (2013.01); *G11C 13/0007* (2013.01); *G11C 13/0069* (2013.01); *G11C 13/0097* (2013.01); *H01L 27/2463* (2013.01); *H01L 45/06* (2013.01); *H01L 45/08* (2013.01); *H01L 45/1233* (2013.01);
(Continued)

(58) Field of Classification Search
None
See application file for complete search history.

(56) References Cited

U.S. PATENT DOCUMENTS

| | | | | |
|---|---|---|---|---|
| 8,912,517 B2* | 12/2014 | Van Buskirk | ...... | G11C 13/0004 257/2 |
| 2012/0026779 A1* | 2/2012 | Ikegami | ............ | G11C 13/0002 365/148 |

(Continued)

*Primary Examiner* — Tan T. Nguyen
(74) *Attorney, Agent, or Firm* — Kilpatrick Townsend & Stockton LLP

(57) ABSTRACT

A memory cell includes a bit line and a reset line sharing a same line, a word line, a first diode including a first N-well region in a substrate, and a first P-type doped region adjacent to the first N-well region that is coupled to a set line, a second diode spaced apart from the first diode and including a second N-well region in the substrate, a first N-type doped region and a second P-type doped region spaced apart from each other and adjacent to the second N-well region, the second P-type doped region coupled to the bit line and the reset line, a bottom electrode coupled to the first P-type doped region and the first N-type doped region, a top electrode coupled to the word line, and a data storage material layer disposed between the bottom electrode and the top electrode.

16 Claims, 3 Drawing Sheets

(52) U.S. Cl.
CPC ........ *H01L 45/1253* (2013.01); *H01L 45/141* (2013.01); *H01L 45/144* (2013.01); *H01L 45/145* (2013.01); *H01L 45/146* (2013.01); *G11C 2013/005* (2013.01); *G11C 2013/009* (2013.01); *G11C 2213/32* (2013.01); *G11C 2213/52* (2013.01); *G11C 2213/72* (2013.01); *G11C 2213/74* (2013.01)

(56) References Cited

U.S. PATENT DOCUMENTS

2017/0301730 A1* 10/2017 Cao ..................... H01L 27/2409
2018/0006086 A1*  1/2018 Chiu .................... H01L 27/224
2019/0066785 A1*  2/2019 Cao ..................... G11C 13/0007

* cited by examiner

US 10,615,224 B2

MEMORY CELL, MEMORY CELL ARRAY AND OPERATING METHOD THEREOF

CROSS-REFERENCES TO RELATED APPLICATIONS

This application claims priority to Chinese patent application No. 201810043063.3, filed with the State Intellectual Property Office of People's Republic of China on Jan. 17, 2018, the content of which is incorporated herein by reference in its entirety for all purposes.

FIELD OF THE INVENTION

The present invention relates generally to integrated circuits. More particularly, embodiments of the present invention relate to a memory cell, a memory cell array, a memory device, and operating method thereof.

BACKGROUND OF THE INVENTION

For a resistive random access memory (RRAM) or phase change random access memory (PCRAM), a 1T1R array structure (1transistor and 1 resistive or phase change memory) is a commonly used array architecture. Compared with the 1T1R array structure, a 2D1R (2 diodes and 1 resistive or phase change memory) array structure may have higher operating current, lower leakage current, and higher array density.

In a conventional 2D1R array structure, a first diode of the two diodes includes a P+ doped region and an N-well, i.e., a PN junction is formed at the interface of the P+ doped region and the N-well, a second diode of the two diodes includes an N+ doped region and a P-well, i.e., a PN region is formed at the interface of the N+doped region and the P-well. In such a 2D1R array structure, the N-well of the first diode serves as a bit line, and the P-well of the second diode serves as a reset line.

However, the current inventors discovered that the above-described 2D1R array structure has a relatively low set current and reset current.

BRIEF SUMMARY OF THE INVENTION

One aspect of the present disclosure provides a memory cell that has a relatively high set and reset currents.

Another aspect of the present disclosure provides a memory cell array that includes a plurality of memory cells arranged in m columns and n rows. Yet another aspect of the present disclosure provides a method of operating a memory cell array.

According to the present disclosure, a memory cell may include a first having a first N-well region in a substrate, and a first P-type doped region adjacent to the first N-well region that is coupled to a set line, and a second diode that is spaced apart from the first diode and includes a second N-well region in the substrate. The memory cell also may include a first N-type doped region and a second P-type doped region spaced apart from each other and adjacent to the second N-well region, the second P-type doped region coupled to the bit line and the reset line, a bottom electrode coupled to the first P-type doped region and the first N-type doped region, a top electrode coupled to the word line, and a data storage material layer disposed between the bottom electrode and the top electrode.

In one embodiment, the data storage material layer includes a phase change material layer or a resistive material layer.

In one embodiment, the phase change material layer includes a doped or undoped chalcogenide.

In one embodiment, the resistive material layer comprises $SiO_2$, NiO, $Cu_xO$, $TiO_2$, or a combination thereof.

In one embodiment, the memory cell may further include a first isolation structure extending from a surface of the substrate into the second N-well region. The first P-type doped region and the first N-type doped region are spaced apart from each other by the first isolation structure.

In one embodiment, the memory cell may further include a second isolation structure extending from a surface of the substrate into a portion of the substrate below the first N-well region and the second N-well region, wherein the first diode and the second diode are spaced apart from each other by the second isolation structure.

In one embodiment, the memory cell may further include a P-type field oxide region below the first N-well region and the second N-well region.

In one embodiment, the bottom electrode includes Pt/Ti, Au/Ti, TiN, Ru, or Cu. In one embodiment, the top electrode includes Al, Pt, Ru, TiN, or TaN.

Embodiments of the present disclosure also provide a memory cell array including a plurality of memory cells arranged in m columns and n rows (m×n), each memory cell being the memory cell as claimed above, and m and n are positive integers, and m×n ≥2. The memory cell array includes a top electrode of a memory cell in an i-th row coupled to an i-th word line, 1≤i≤n, a first N-well region of a first diode in a memory cell of a j-th column coupled to a j-th set line, 1≤m, a second P-type doped region of a second diode in the memory cell of the j-th column coupled to a j-th reset line, 1≤j≤m, a third N-well region and a third N-type doped region adjacent to the third N-well region disposed in at least every other row of memory cells in the j-th column, a voltage source circuit configured to provide a 0V voltage, a set voltage, a reset voltage, a read voltage to perform set, reset, and read operations. The first N-well region of the first diode in the memory cell of the j-th column is coupled to the j-th set line through the third N-well region and the third N-type doped region.

In one embodiment, the set voltage is coupled to an i-th word line and no voltage is coupled to other word lines that are not the i-th word line, the 0V voltage is coupled to a j-th set line and no voltage is coupled set lines that are not the j-th set lines, and no voltage applied to reset lines when performing a set operation to a memory cell in the i-th row and in the j-th column.

In one embodiment, the set voltage is coupled to an i-th word line and no voltage is coupled to other word lines that are not the i-th word line, the 0V voltage is coupled to a j-th set line and no voltage is coupled to other set lines, and no voltage is coupled to reset lines when performing a reset operation to a memory cell in the i-th row and in the j-th column.

In one embodiment, the 0V voltage is coupled to an i-th word line and no voltage is coupled to other word lines that are not the i-th word line, no voltage coupled to all reset lines, and the read voltage is coupled to a j-th reset line and no voltage coupled to reset lines that are not the j-th reset line when performing a read operation to a memory cell in the i-th row and in the j-th column.

Embodiments of the present disclosure also provide a method for operating the above-claimed memory cell array. The method may include performing a set operation on a memory cell in an i-th row and a j-th column, 1≤i≤n, 1≤j≤m. Performing the set operation may include applying a set voltage to an i-th set line and no voltage to set lines that are not the i-th set line; applying the 0V voltage to a j-th set line and no voltage to set lines that are not the j-th set line; and applying no voltage to all reset lines.

In one embodiment, the method may further include performing a reset operation on the memory cell in the i-th row and j-th column. In one embodiment, performing the reset operation includes applying the 0V voltage to an i-th word line and no voltage to word lines that are not the i-th word line; applying no voltage to all set lines; and applying the reset voltage to a j-th reset line and the 0V voltage to reset lines that are not the j-th reset lines.

In one embodiment, the method may also include performing a read operation on the memory cell in the i-th row and j-th column. In one embodiment, performing the read operation includes applying a 0V voltage level to an i-th word line and no voltage to word lines that are not the i-th word line; applying no voltage to all set lines; and applying the read voltage to a j-th reset line and no voltage to reset lines that are not the j-th reset line.

The following description, together with the accompanying drawings, will provide a better understanding of the nature and advantages of the claimed invention.

BRIEF DESCRIPTION OF THE DRAWINGS

Embodiments of the present disclosure are described with reference to the accompanying drawings. In the drawings, like reference numbers may indicate identical or functionally similar elements.

DETAILED DESCRIPTION OF THE INVENTION

Figure 1:
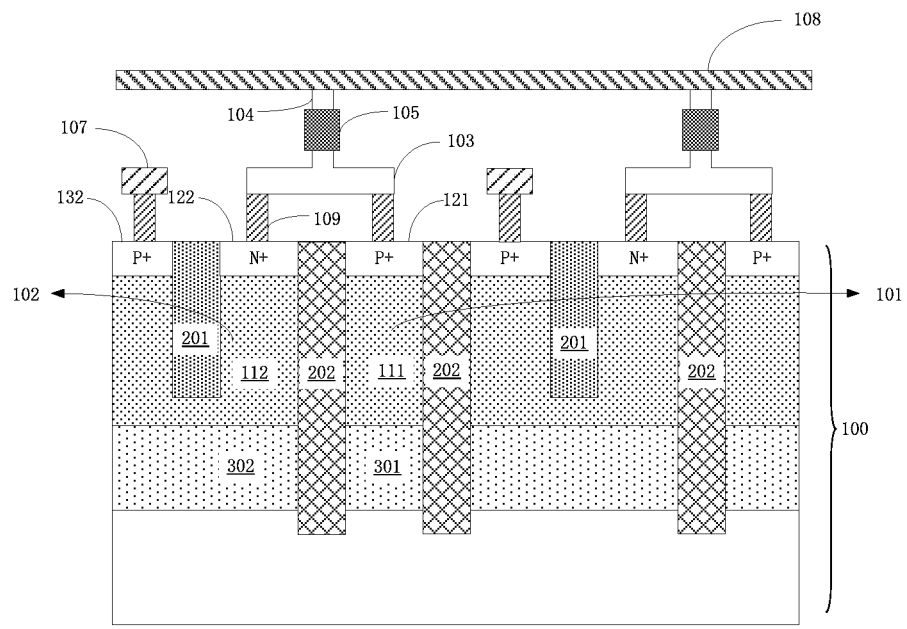
FIG. 1 is a cross-sectional view illustrating a memory cell according to one embodiment of the present disclosure.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It will be understood that the drawings are not drawn to scale, and similar reference numbers are used for representing similar elements. Embodiments of the invention are described herein with reference to functional block diagrams that are schematic illustrations of idealized embodiments (and intermediate structures) of the invention. For purposes of clarity, not every component may be labeled in every drawing.

It will be understood that, when an element or component is referred to as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

In a non-limiting embodiment, a resistive RAM cell has a low resistance state (referred to as a "set" state) corresponding to a logic "1" and a high resistance state (referred to as a "reset" state) corresponding to a logic "0."

FIG. 1 is a cross-sectional view of a memory cell according to one embodiment of the present disclosure. As shown in FIG. 1, a memory cell may include a first diode 101 and a second diode 102 that are spaced apart from each other. The memory cell may also include a bottom electrode 103, a top electrode 104, and a data storage material layer 105 between the bottom electrode 103 and the top electrode 104.

The first diode 101 may include a first N-well region 111 in a substrate 100, the first N-well region 111 is coupled to a set line (not shown). The first diode 101 may also include a first P-type doped region 121 (shown as P+) adjacent to the first N-well region 111. Herein, the substrate 100 may be an elemental semiconductor substrate such as a silicon substrate or a germanium substrate, or the substrate 100 may be a compound semiconductor substrate such as gallium arsenide or the like. The first P-type doped region 121 is coupled to the bottom electrode 103, e.g., through a contact 109.

The second diode 102 may include a second N-well region 112 in the substrate 100, a first N-type doped region 122 (shown as N+) and a second P-doped region 132 (shown as P+) spaced apart from each other and adjacent to the second N-well region 112. The first N-type doped region 122 is coupled to the bottom electrode 103 (e.g., through a contact 109), and the second P-type doped region 132 is coupled to a bit line and a reset line, e.g., through a contact 109. Herein, the bit line and the reset line share a same line 107. In the following description, the bit bit line and the reset line may also be referred to as the same line 107. In one embodiment, the memory cell may include a first isolation structure 201 extending from the upper surface of the substrate 100 into the second N-well region 112 but not through the second N-well region 112. Thus, the second P-type doped region 132 and the second N-type doped region 122 may be spaced apart from each other by the first isolation structure 201.

The bottom electrode 103 is coupled to the first P-type doped region 121 and the first N-type doped region 122, e.g., through the contacts 109, and the top electrode 104 is coupled to a word line 108. In an embodiment, the bottom electrode may include Pt/Ti, Au/Ti, TiN, Ru, or Cu, and the top electrode may include Al, Pt, Ru, TiN, or TaN.

The data storage material layer 105 may include a phase change material layer or a resistive material layer. The phase change material layer may be switched between an amorphous state (phase) and a crystalline state (phase), the amorphous state (phase) represents a resistance value that is retained until changed by a programming event. The resistive material layer may be switched between a high-resistance state and a low-resistance state under different applied voltages. In an embodiment, the phase change material layer may be a doped or undoped chalcogenide, such as $Ge_2Sb_2Te_2$ or $Sb_2Te_3$. In an exemplary embodiment, the resistive material layer may include one or more of $SiO_2$, NiO, CuxO, and $TiO_2$.

In the memory cell of the embodiment, the first diode and the second diode each include an N-well region, the first N-well region of the first diode is coupled to the set line, and the second P-type doped region of the second diode is coupled to the same line operative as the bit line and the reset line. The sheet resistance of the N-well region is smaller than the sheet resistance of the P-well region, and the reset line and set line each may include a metal material. Compared with conventional memory cell structures, the memory cell of the present embodiment provides a larger reset current and a larger set current that conventional memory cells that use the N-well of the first diode as a bit line and the P-well of the second diode as a reset line.

In one embodiment, the memory cell may further include a second isolation structure 202. The second isolation structure 202 may extend from the upper surface of the substrate 100 into a portion of the substrate 100 below the first N-well region 111 and the second N-well region 112. Therefore, the first diode 101 and the second diode 102 may be spaced apart from each other by the second isolation structure 202. The first isolation structure 201 extends from the upper surface of the substrate 100 into the first N-well region 111 and the second N-well 112. The second isolation structure 202 may extend from the upper surface of the substrate 100 and into a portion of the substrate below the first N-well region 111 and the second N-well region 112. In this sense, the first isolation structure 201 may be a shallow trench isolation structure (STI), and the second isolation structure 202 may be a deep trench isolation structure (DTI).

In one embodiment, in order to provide a better isolation between the first diode 101 and the second diode 102, the memory cell may further include a P-type field oxide region, such as a first P-type field oxide region 301 below the first N-well region 111 and a second P-type field oxide region 302 below the second N-well region 112.

The present disclosure also provides a memory cell array including a plurality of memory cells arranged in m columns and n rows (m×n) on a substrate as described in the above sections, such as the memory cells shown in FIG. 1. Herein, m×n ≥2, and m and n are positive integers.

Figure 2:
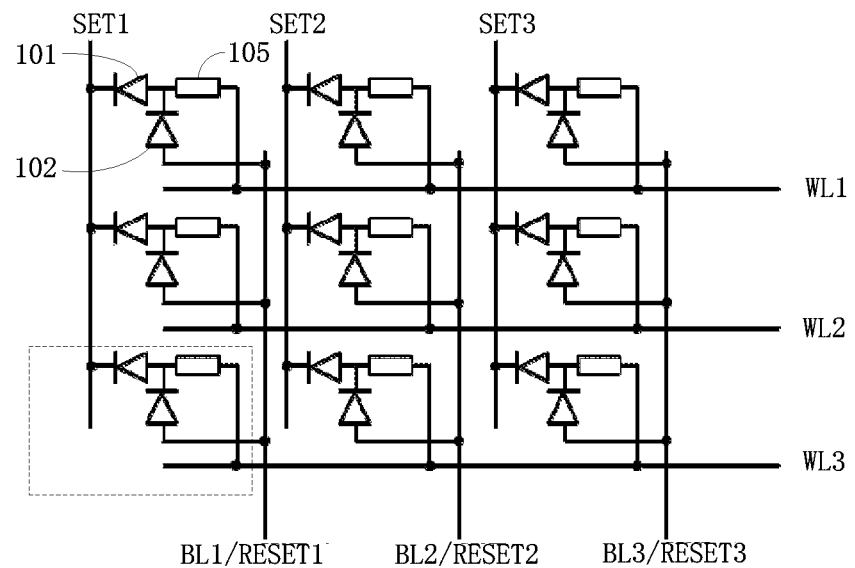
FIG. 2 is a schematic circuit diagram illustrating a memory cell array structure according to one embodiment of the present disclosure.

FIG. 2 is a circuit diagram of a memory cell array according to one embodiment of the present disclosure. In FIG. 2, a dotted box represents a memory cell. FIG. 2 shows a circuit diagram of memory cells arranged in 3 columns and 3 rows, i.e., m=3, and n=3.

In the memory cell array, the top electrode 104 of each of the memory cells in the i-th row is coupled to the i-th word line, $1 \leq i \leq n$. For example, the top electrode 104 of each of the memory cells in the first row is coupled to the first word line WL1, the top electrode 104 of each of the memory cells in the second row is coupled to the second word line WL2, and the top electrode 104 of each of the memory cells in the third row is coupled to the third word line WL3.

In the memory cell array, the first N-well region 111 of the first diode 101 of each of the memory cells in the j-th column is coupled to the j-th set line, $1 \leq j \leq m$. For example, the first N-well region 111 of the first diode 101 of each of the memory cells in the first column is coupled to the first set line SET1, the second N-well region 111 of the first diode 101 of each of the memory cells in the second column is coupled to the second set line SET2, and the third N-well region 111 of the first diode 101 of each of the memory cells in the third column is coupled to the third set line SET3.

In the memory cell array, the second P-type doped region 132 of the second diode 102 in the memory cell of the j-th column is coupled to the j-th reset line, $1 \leq j \leq m$. For example, the second P-type doped region 132 of the second diode 102 of each of the memory cells in the first column is coupled to the first reset line RESET1, the second P-type doped region 132 of the second diode 102 of each of the memory cells in the second column is coupled to the second reset line RESET2, and the second P-type doped region 132 of the second diode 102 of each of the memory cells in the third column is coupled to the third reset line RESET3.

Figure 3:
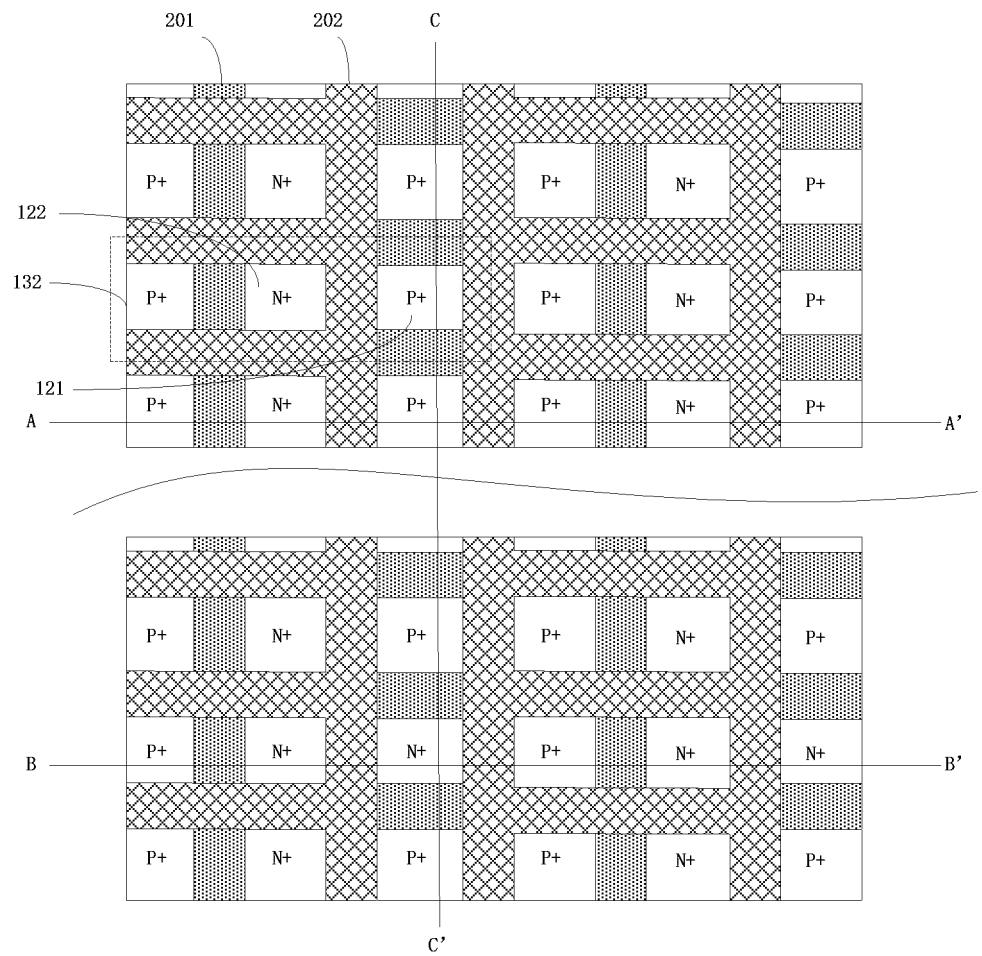
FIG. 3 is a schematic layout diagram illustrating a memory cell array structure according to one embodiment of the present disclosure.
Figure 4A:
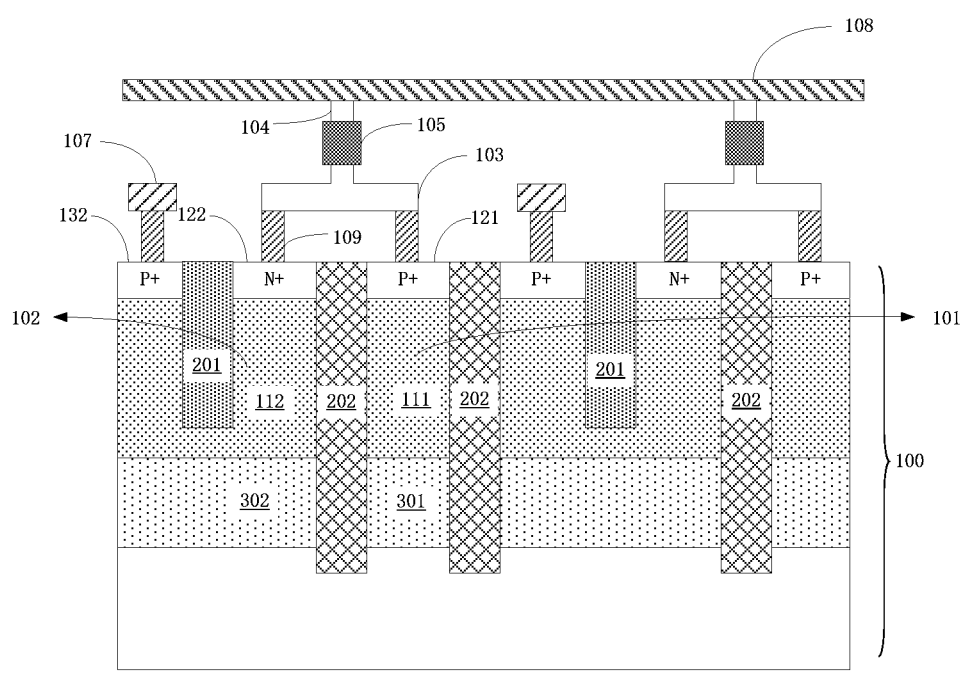
FIG. 4A is a cross-sectional view illustrating a memory cell array structure taken along the line A-A' of the memory cell array structure in FIG. 3.
Figure 4B:
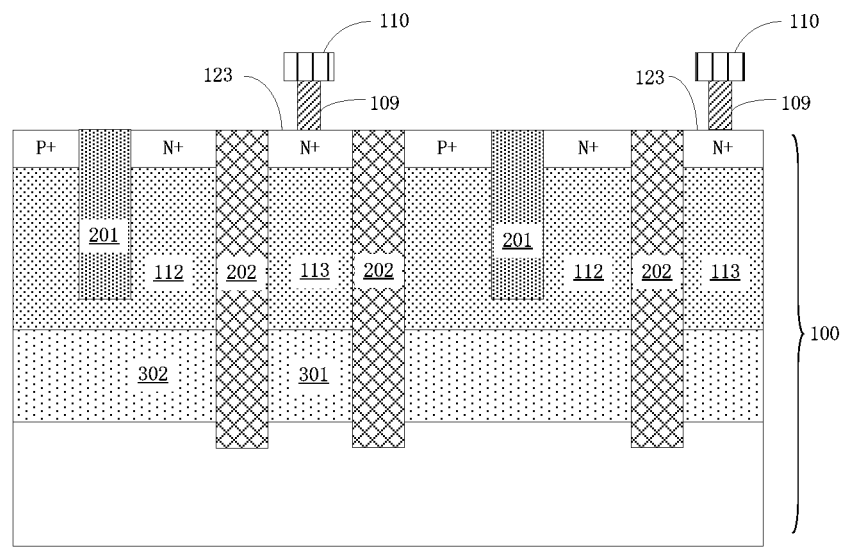
FIG. 4B is a cross-sectional view illustrating a memory cell array structure taken along the line B-B' of the memory cell array structure in FIG. 3.
Figure 4C:
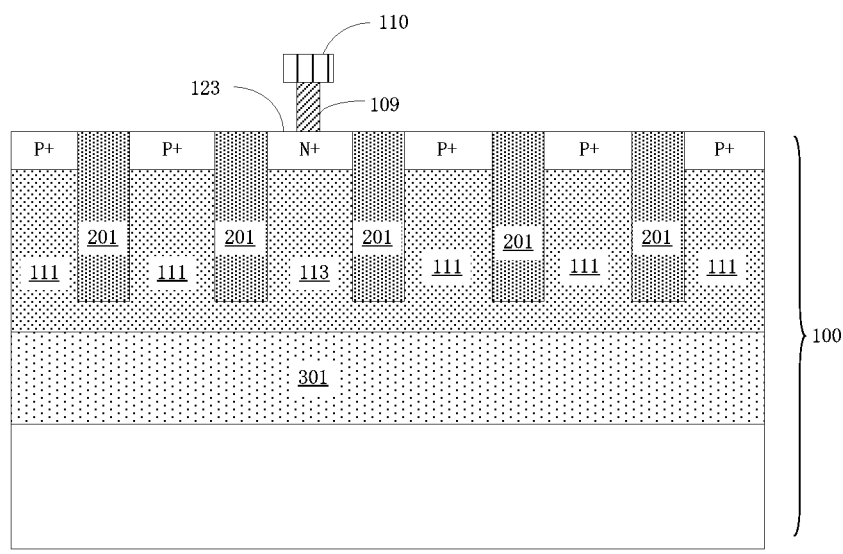
FIG. 4C is a cross-sectional view illustrating a memory cell array structure taken along the line C-C' of the memory cell array structure in FIG. 3.

FIG. 3 is a schematic layout diagram illustrating a memory cell array structure according to one embodiment of the present disclosure. FIG. 4A is a cross-sectional view illustrating a memory cell array structure taken along the line A-A' of the memory cell array structure shown in FIG. 3. FIG. 4B is a cross-sectional view illustrating a memory cell array structure taken along the line B-B' of the memory cell array structure of FIG. 3. FIG. 4C is a cross-sectional view illustrating a memory cell array structure taken along the line C-C' of the memory cell array structure of FIG. 3

Referring to FIG. 3, FIG. 4B, and FIG. 4C, in the memory cell array, at least every other row of the memory cells in the j-th column includes a third N-well region 113 and a third N-type doped region 123 (shown as N+) adjacent to the third N-well region 113. The first N-well region 111 of the first diode of the memory cells in the j-th column may be coupled to the j-th set line 110 through the third N-well region 113 and the third N-type doped region 123. For example, every second, third, or fourth row of the memory cells may include a third N-well region 113 and a third N-type doped region 123 adjacent to the third N-well region 113.

The number M of rows of memory cells that are spaced apart from each other between the third N-type doped regions 123 in the same column can be determined according to the required set current amount and the required reset current amount. For example, if a large set current and a large reset current are required, the number M can be set to a smaller value. If a small set current and a small reset current are required, the number M can be set to a larger value.

Assuming that the actual area of each memory cell is 12 $F^2$, i.e., the total area of the memory cell array can be considered as m×n $(12+12/M)F^2$. Therefore, the memory cell array of the above-described embodiment may take into consideration the amount of the set current and reset current, and the area of the memory cell array.

It is to be understood that a second diode may also be disposed between the third N-type doped regions 123 in the same row, but the second N-type doped region (N+) of the second diode is not coupled to the bottom electrode 103, and the second P-type doped region (P+) is also not coupled to the line 107.

The operating conditions for setting, resetting, and reading a memory cell array will be described below. In some embodiments, the memory cell array of FIG. 3 also include a voltage source circuit (not shown) that is configured to provide predetermined voltages to enable operations of the memory cell array. In some embodiments, the operations may include a set operation, a reset operation, and a read operation. In some embodiments, other operations may also be supported. In one embodiment, the voltage source circuit may provide a 0V voltage, a set voltage, a reset voltage, and a read voltage to perform a set operation, a reset operation, and a read operation. The set operation places the memory cell in the "set" state, the reset operation places the memory cell in the "reset" state, and the read operation that reads a value stored in the memory cell.

(1) The operating conditions for performing the set operation on a memory cell arranged in the i-th row and j-th column includes: applying a set voltage Vset greater than 0V (i.e., ground potential) to an i-th word line, while floating other word lines that are not the i-th word line (i.e., applying no voltage to all other word lines); applying a 0V voltage to the j-th set line while floating other set lines that are not the j-th set line ((i.e., applying no voltage to all other set lines), and floating all the reset lines(i.e., applying no voltage to all reset lines).

(2) The operating conditions for performing the reset operation on a memory cell arranged in the i-th row and j-th column memory cell includes: applying the 0V voltage an i-th word line, while floating other word lines that are not the i-th word line (i.e., applying no voltage to all other word lines); applying a reset voltage Vreset greater than 0V to the j-th reset line while floating other reset lines that are not the j-th reset line (i.e., applying no voltage to all other reset lines), and applying the 0V voltage to all the reset lines that are not the j-th reset line.

(3) The operating conditions for performing the read operation on a memory cell arranged the i-th row and j-th column memory cell includes: applying the 0V voltage to the i-th word line, while floating other word lines that are not the i-th word line (i.e., applying no voltage to all other word lines that are not the i-th word line); floating all set lines (i.e., applying no voltage to all set lines); and applying a read voltage Vread greater than 0V to the j-th reset line and floating all reset lines that are not the j-th bit line (i.e., applying no voltage to all other reset lines that are not the j-th reset line).

In some embodiments, each of the Vset and Vreset voltages may be greater than Vread. For example, the Vset and Vreset voltages may be in the range between 3V and 5V, and the Vread voltage may be in the range between 1V and 1.5V.

Thus, the present disclosure provides a method for operating a memory cell array based on the above-described embodiments. The operating method may include performing any one of a set operation, a reset operation, and a read operation on a memory cell in the i-th row and j-th column.

The SET, RESET, and READ operations will be described below.

SET Operation

Performing a SET operation on a memory cell in an i-th row and j-th column includes: applying a set voltage Vset to the i-th word line, floating other word lines other than the i-th word line (i.e., applying no voltage to other word lines that are not the i-th word line); applying a 0V voltage to the j-th set line, and floating other set lines other than the j-th set line (i.e., applying no voltage to other set lines that are not the i-th word line); and floating all reset lines.

RESET Operation

Performing a RESET operation on the memory cell in the i-th row and j-th column includes: applying the 0V voltage to an i-th word line, while floating other word lines that are not the i-th word line (i.e., applying no voltage to other word lines that are not the i-th word line); floating all set lines; applying a reset voltage Vreset to the j-th reset line, and applying the 0V voltage to all other reset lines that are not the j-th reset line.

READ Operation

Performing a READ operation on the memory cell in i-th row and j-th column includes: applying the 0V voltage to the i-th word line, while floating other word lines other than the i-th word line (i.e., applying no voltage to other word lines that are not the i-th word line); floating all set lines; applying a read voltage Vread to the j-th reset line while floating other reset lines other than the j-th reset line (i.e., applying no voltage to other reset lines that are not the j-th reset line).

The present disclosure also provides a memory device that may include the memory cell array of the above-described embodiments. In one embodiment, the memory device may include a resistive memory cell array. In other embodiment, the memory cell may include a phase change memory cell array.

In summary, the above-described embodiments of the present disclosure provide a memory cell, a memory cell array including the memory cell, a semiconductor device including the memory cell array, and a method of operating the memory cell array.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the embodiments of the present disclosure could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A memory cell comprising:
   a bit line and a reset line sharing a same line;
   a word line;
   a first diode comprising a first N-well region in a substrate, and a first P-type doped region adjacent to the first N-well region, the first N-well region coupled to a set line;
   a second diode spaced apart from the first diode and comprising a second N-well region in the substrate, a first N-type doped region and a second P-type doped region spaced apart from each other and adjacent to the second N-well region, the second P-type doped region coupled to the bit line and the reset line;
   a bottom electrode coupled to the first P-type doped region and the first N-type doped region;
   a top electrode coupled to the word line; and
   a data storage material layer disposed between the bottom electrode and the top electrode.

2. The memory cell of claim 1, wherein the data storage material layer comprises a phase change material layer or a resistive material layer.

3. The memory cell of claim 2, wherein the phase change material layer comprises a doped or undoped chalcogenide.

4. The memory cell of claim 2, wherein the resistive material layer comprises $SiO_2$, NiO, $Cu_xO$, $TiO_2$, or a combination thereof.

5. The memory cell of claim 1, further comprising a first isolation structure extending from a surface of the substrate into the second N-well region, wherein the second P-type doped region and the first N-type doped region are spaced apart from each other by the first isolation structure.

6. The memory cell of claim 1, further comprising a second isolation structure extending from a surface of the substrate into a portion of the substrate below the first N-well region and the second N-well region, wherein the first diode and the second diode are spaced apart from each other by the second isolation structure.

7. The memory cell of claim 1, further comprising a P-type field oxide region below the first N-well region and the second N-well region.

8. The memory cell of claim 1, wherein the bottom electrode comprises Pt/Ti, Au/Ti, TiN, Ru, or Cu.

9. The memory cell of claim 1, wherein the top electrode comprises Al, Pt, Ru, TiN, or TaN.

10. A memory cell array including a plurality of memory cells arranged in m columns and n rows (m×n), each memory cell being the memory cell as claimed in claim 1, m and n being positive integers, and m'n≥2, the memory cell array comprising:
   a top electrode of a memory cell in an i-th row coupled to an i-th word line, 1≤i≤n;
   a first N-well region of a first diode in a memory cell of a j-th column coupled to a j-th set line, 1≤j≤m;
   a second P-type doped region of a second diode in the memory cell of the j-th column coupled to a j-th reset line, 1≤j≤m;
   a third N-well region and a third N-type doped region adjacent to the third N-well region disposed in at least every other row of memory cells in the j-th column;
   a voltage source circuit configured to provide a 0V voltage, a set voltage, a reset voltage, a read voltage to perform set, reset, and read operations;
   wherein the first N-well region of the first diode in the memory cell of the j-th column is coupled to the j-th set line through the third N-well region and the third N-type doped region.

11. The memory cell array of claim 10, wherein the set voltage is coupled to an i-th word line and no voltage is coupled to other word lines that are not the i-th word line, the 0V voltage is coupled to a j-th set line and no voltage is coupled set lines that are not the j-th set line, and no voltage applied to reset lines when performing a set operation to a memory cell in the i-th row and in the j-th column.

12. The memory cell array of claim 10, wherein the set voltage is coupled to an i-th word line and no voltage is coupled to other word lines that are not the i-th word line, the 0V voltage is coupled to a j-th set line and no voltage is coupled to other set lines, and no voltage is coupled to reset lines when performing a reset operation to a memory cell in the i-th row and in the j-th column.

13. The memory cell array of claim 10, wherein the 0V voltage is coupled to an i-th word line and no voltage is coupled to other word lines that are not the i-th word line, no voltage coupled to all reset lines, and the read voltage is coupled to the j-th reset line and no voltage coupled to reset lines that are not the j-th reset line when performing a read operation to a memory cell in the i-th row and in the j-th column.

14. A method for operating the memory cell array of claim 10, the method comprising:
   performing a set operation on a memory cell in an i-th row and a j-th column, 1≤i≤n, 1≤j≤m, wherein performing the set operation comprises:
   applying a set voltage to an i-th set line and no voltage to set lines that are not the i-th set line;
   applying the 0V voltage to a j-th set line and no voltage to set lines that are not the j-th set line; and
   applying no voltage to all reset lines.

15. The method of claim 14, further comprising:
   performing a reset operation on the memory cell in the i-th row and j-th column, wherein performing the reset operation comprises:
   applying the 0V voltage to an i-th word line and no voltage to word lines that are not the i-th word line;
   applying no voltage to all set lines; and
   applying the reset voltage to a j-th reset line and the 0V voltage to reset lines that are not the j-th reset line.

16. The method of claim 14, further comprising:
   performing a read operation on the memory cell in the i-th row and j-th column, wherein performing the read operation comprises:
   applying a 0V voltage level to an i-th word line and no voltage to word lines that are not the i-th word line;
   applying no voltage to all set lines; and
   applying the read voltage to a j-th reset line and no voltage to reset lines that are not the j-th reset line.

* * * * *